United States Patent

McFadyen

[15] 3,691,465

[45] Sept. 12, 1972

[54] LOW LEVEL AM DETECTOR AND AUTOMATIC GAIN CONTROL NETWORK

[72] Inventor: Robert I. McFadyen, 4892 South Salina St., Syracuse, N.Y. 13205

[22] Filed: Dec. 14, 1970

[21] Appl. No.: 97,680

Related U.S. Application Data

[63] Continuation-in-part of Ser. No. 5,819, Jan. 26, 1970, abandoned.

[52] U.S. Cl. ..................325/319, 325/399, 325/404, 325/409, 325/411, 325/414, 325/415, 329/203, 329/204, 329/206

[51] Int. Cl. ..............................................H04b 1/16

[58] Field of Search......325/397, 399, 400, 403, 404, 325/405, 409, 410, 411, 414, 485, 484, 319, 415; 330/29, 87, 88, 89, 90, 97, 98–100, 103; 329/101, 203, 204, 206

[56] References Cited

UNITED STATES PATENTS 3,440,543 4/1969 Polzl..........................325/319

*Primary Examiner*—Albert J. Mayer

*Attorney*—Richard V. Lang, Carl W. Baker, Frank L. Neuhauser, Oscar B. Waddell and Joseph B. Forman

[57] ABSTRACT

An improved low level AM detector and automatic gain control network is described. The network includes a degenerative feedback amplifier and a semiconductor detector diode connected at the output of the amplifier to rectify the amplified signal and the signal in the feedback path. The amplifier includes high voltage gain transistor input amplification and a unity gain transistor output amplifier in emitter follower configuration coupled to the detector diode. A subsequent stage produces amplified audio and a.g.c. signals. In one embodiment average detection is employed, while in another peak detection is employed. The network exhibits high detection sensitivity, improved detection linearity and permits highly sensitive a.g.c. operation. While using solid state active devices, both discrete and monolithic modes of circuit assembly are contemplated.

15 Claims, 4 Drawing Figures

INVENTOR:
ROBERT J. McFADYEN,
BY Richard V. Lang
HIS ATTORNEY.

INVENTOR:
ROBERT J. McFADYEN,
BY Richard V. Lang
HIS ATTORNEY.

LOW LEVEL AM DETECTOR AND AUTOMATIC GAIN CONTROL NETWORK

The present invention is a continuation-in-part of U.S. patent application Ser. No. 5,819, filed Jan. 26, 1970 now abandoned.

BACKGROUND OF THE INVENTION

1. Field of the Invention

The present invention relates to detection circuits for use in amplitude modulation radio receivers for home, communications and telemetry applications and more particularly to circuits suitable for assembly in either discrete or monolithic form and employing solid state active components. The network herein described provides both the detection function and the production of an automatic control voltage for adjusting gain in earlier portions of an amplitude modulation receiver.

2. Description of the Prior Art

Of several known techniques for recovering the modulation from an amplitude modulated signal, the halfwave diode detector is probably the most common. Synchronous detection, "stripped carrier" detection, linear squaring, and fullwave linear detection are known alternative detection techniques. Each has certain advantages over the halfwave rectifier but all generally are both in themselves more complex and require rather substantial rearrangement within a radio receiver to make them feasible.

The halfwave detector has been used almost from the dawn of electronics and continues in use today. Today, however, the vacuum diode is rather generally being replaced by the semiconductor diode. The diode detector was early understood to have less than an ideal rectification characteristic. Later it was discovered that the detection network could embrace auxiliary functions, such as the production of an automatic gain control voltage. The automatic gain control voltage was used to restrict the range of signal levels that would be applied to the detector and to stabilize not only the levels of signals that the listener would encounter from the loudspeaker, but also prevent the earlier stages of a radio receiver from overloading in the presence of strong received signals. The vacuum diode detector ordinarily worked at relatively high signal levels (typically 15 to 20 volts) but possessed both initial and terminal curvatures in its output characteristic.

The semiconductor diode possesses an initial logarithmic curvature in the detection characteristic and at very high levels it saturates—much the same as a vacuum diode. The distortion producing curvature, which is greatest at the lower signal levels, sets minimum acceptable signal levels. While diode limitations do not place very low upper limits on the signal levels, the associated low voltage input and output circuitry usually does set maximum values of a volt or two.

The conventional way of employing a semiconductor diode is to assume upper and lower limits to the input signal excursions and to provide a dc bias to cause the diode to operate over the most linear portion of its forward conduction characteristic between those limits. In concept, the diode is treated as consisting of a resistance corresponding to the average resistance in the center of its selected range of operation and a battery of 0.3 to 0.4 volts corresponding to the offset of the intercept of that resistance with the origin. Assuming ordinary tolerances of 2 percent distortion at 30 percent modulation and a maximum input level of 1 volt peak to peak, the dynamic range of a conventional semiconductor diode is around 6 db. To one seeking high quality low level detection, the foregoing limits are undesirably restrictive.

SUMMARY OF THE INVENTION

Accordingly it is an object of the present invention to devise a detection network for low level a.m. signals incorporating a semiconductor diode which is of increased dynamic range and linearity.

It is a further object of the present invention to provide an improved solid state network for detection and derivation of an automatic gain control voltage.

It is another object of the invention to provide an improved detection and automatic gain control network suitable for integrated circuit assembly.

It is another object of the present invention to provide an improved detection and automatic gain control network economic of components, easily manufactured, and tolerant of changing environment.

These and other objects of the invention are achieved in a novel combination comprising an amplifier having a forward gain path and a degenerative shunt feedback for linearizing the relationship between output and input signals and a semiconductor diode serially connected at the output of the amplifier to rectify the amplified signal and the signal in the feedback path. The amplifier includes a first transistor in common emitter configuration exhibiting high voltage gain and a second transistor in emitter follower configuration having substantially unity voltage gain, which is coupled to said diode. Both paths in said amplifier are dc paths so that the collector potential of the first transistor is made substantially equal to the combined voltage drops in the input junctions of the two transistors and the diode.

In addition, in one embodiment a third transistor is provided having its base coupled to the diode and in voltage amplifying common emitter configuration for deriving amplified audio and a.g.c voltages. The dc connection of the base of the third transistor to the diode then establishes the potential of the base at a value sufficiently close to the desired value such that a small valued, unbypassed resistance will provide the exact value desired without appreciable audio frequency degeneration. When transistors 1 and 3 are matched in respect to their base-to-emitter voltages as by selection or by formation in a common semiconductor chip the overall network is stable both against temperature changes and deterioration in dc source potentials.

In a second embodiment providing lower distortion than the first embodiment, the detector is arranged to provide peak detection by the connection of a storage capacitor at the detector output terminal. Amplification of the detected audio signal and the automatic gain control signal occurs in the following direct coupled stage, the automatic gain control voltage being passed through a pair of mutually isolated low pass filters. By further reducing audio feedthrough into the automatic gain control bus, this measure further reduces distortion of the detected signal. The second low pass filter is provided with a pair of reversely poled semiconductor diodes shunting the series resistor to effect a nonlinear resistance in the filter. This permits the second low pass filter to have a long time constant for signals in tune, while having a rapid response as when the receiver is being tuned between stations.

BRIEF DESCRIPTION OF THE DRAWING

The novel and distinctive features of the invention are set forth in the claims appended to the present application. The invention itself, however, together with the further objects and advantages thereof may best be understood by reference to the following description and accompanying drawings, in which:

DESCRIPTION OF PREFERRED EMBODIMENTS

Figure 1:
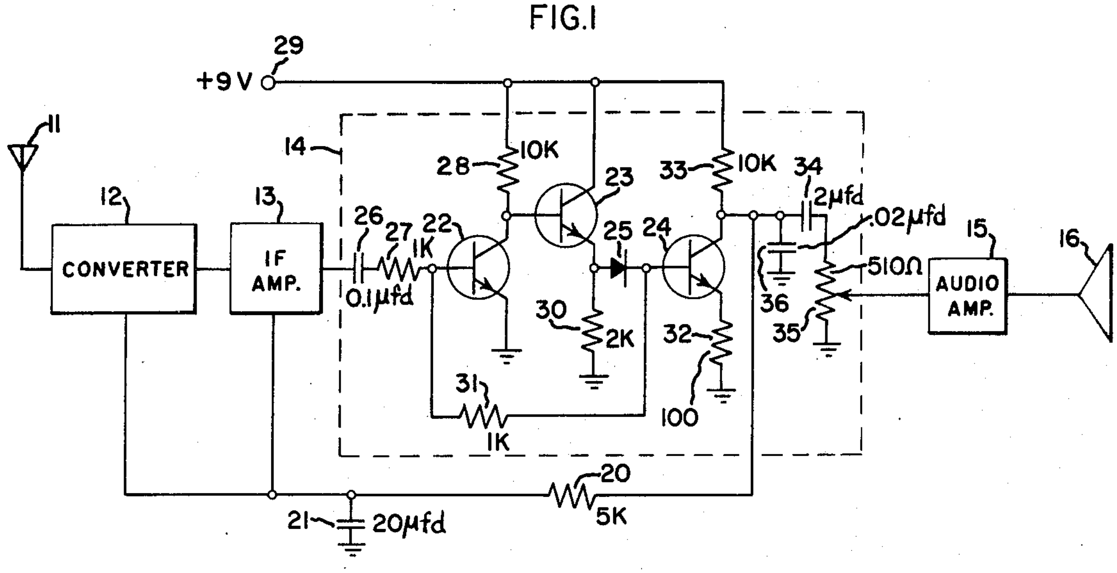
FIG. 1 is an electrical circuit representation of a novel detector and automatic gain control network disposed in a superheterodyne radio receiver.

Referring to FIG. 1, a superheterodyne radio receiver is shown incorporating the novel detector and automatic gain control network. The superheterodyne receiver is seen to comprise four blocks serially interconnected between an antenna 11 and a loudspeaker 16. These blocks comprise, respectively, a converter 12, an intermediate frequency amplifier 13, the detector and automatic gain control network 14 (shown in dashed outline) and an audio amplifier 15.

The receiver so depicted receives a signal in the antenna 11 at the frequency of transmission and the signal is converted to a fixed, usually lower, intermediate frequency in the converter 12. The signal is next amplified in the intermediate frequency amplifier 13. The I.F. amplifier 13 is of conventional solid state circuit design. It contains the selectivity necessary to eliminate interference between adjacent signals, the gain necessary to raise the level of the single signal selected to a level suitable for detection and it is of relatively low output impedance. The detector and automatic gain control network 14, while in principle not restricted to use with amplifiers of relatively low output impedance, is illustrated in FIG. 1 with input impedances selected for an application in which the output of the I.F. amplifier is derived from an emitter follower output stage (not shown).

The primary function of the detector and automatic gain control network 14 is to detect the signal derived from the I.F. amplifier 13 and to couple a detected audio signal to the succeeding audio amplifier 15. The amplifier 15 then powers a loudspeaker 16. A secondary function of network 14 is to develop an automatic gain control voltage. This a.g.c. voltage is fed through suitable filter elements 20, 21 to control the gain of the converter 12 and the I.F. amplifier 13 so as to stabilize the level of the signal in the detector 14 (and in the loudspeaker 16) against variations in input signal strength. Both functions are conventionally associated in a common circuit.

The novel detector and automatic gain control network 14 includes three transistors 22, 23 and 24 and a diode 25. The transistor 22 forms part of an input amplifier of substantial voltage gain and is coupled in common emitter configuration. The signal from the I.F. amplifier 13 is coupled to the base of the input transistor 22 through series connected coupling capacitor 26 and resistance 27. The emitter of transistor 22 is grounded. A resistance 28 coupled between the transistor collector and a source 29 of positive bias potentials forms the load of the input amplifier.

The signal derived from the collector of input transistor 22 is applied by a dc path to the base of the second transistor 23. Transistor 23 is connected in an emitter follower configuration. In this configuration, impedance transformation (i.e., current but not voltage amplification) and certain ancillary functions to be detailed later are accomplished. The collector of transistor 23 is directly connected to the bias source 29, while its emitter is coupled through an output load resistance 30 to ground. The signal of the emitter of transistor 23 is in turn coupled through the diode 25 to the base of the third transistor 24 (the anode of diode 25 being coupled to the emitter of transistor 23 and its cathode being coupled to the base of a third transistor 24). The diode 25 recovers the signal modulation.

A resistor 31 connected between the cathode of diode 25 and the base of the first transistor 22 forms a degenerative shunt feedback connection across the two transistor amplifiers. The effect of this feedback connection and the internal functioning of the circuit so far described will be detailed after a brief consideration of the remainder of the network 14 and the utilization of the output quantities.

The detected signal available at the cathode of the diode 25 is coupled to the base of the third transistor 24, which is connected in a signal amplifying common emitter configuration. A biasing resistance 32 is connected in the path between the emitter of transistor 24 and ground. The collector of the transistor 24 is connected to the bias source 29 through an output load resistance 33. Audio signals amplified in transistor 24 thus appear at the collector and are coupled through a coupling capacitor 34 to a potentiometer 35. The audio amplifier 15 is connected to a tap on potentiometer 35 and feeds further amplified detected signals to the loudspeaker 16. An additional capacitor 36 coupled between the collector of transistor 24 and ground is a low pass filter for eliminating signals above audio frequency from the audio output of the network 14.

The a.g.c. connection is also taken from the collector of the transistor 24. In accordance with convention, the a.g.c. voltage is a time average of the detected signal, the time average being selected to be longer than the lowest audible frequency. The network 20, 21, previously identified, has the requisite time constant and is in the path coupling the a.g.c. voltage to the converter and I.F. amplifier stages.

The performance of the detection function in the detector and automatic gain control network 14 will now be considered. The diode 25 in the network 14 is a half-wave detector linearized by being serially connected in the forward gain path of the amplifier portion of the network 14 at the output and rectifying signals introduced into the degenerative feedback path around that amplifier portion.

Analysis of the circuit as a standard shunt feedback amplifier indicates a substantial improvement in linearity from the foregoing configuration and this is confirmed by actual measurements. The expression $e_o$ (detected output) in a shunt feedback amplifier is as follows:

$$e_o \cong -\frac{R_{31}}{R_{27}} e_i \qquad (1)$$

where $R_{27}$, $R_{31}$ are the resistances of input resistance element 27 and shunt feedback resistance 31 respectively and $e_i$ is the input modulation component.

The calculated (and measured) gain of the first and second amplifiers (transistors 22, 23) is approximately 200 in a practical case, while analysis shows that the $\gamma\beta$ product ($\gamma$ being the forward gain; $\beta$ the backward gain in the feedback loop) exceeds 60. From this, one may conclude that the above equation is linear to an accuracy exceeding 2 percent (assuming a nominal detector input level establishing a given dynamic resistance).

Figure 2A:
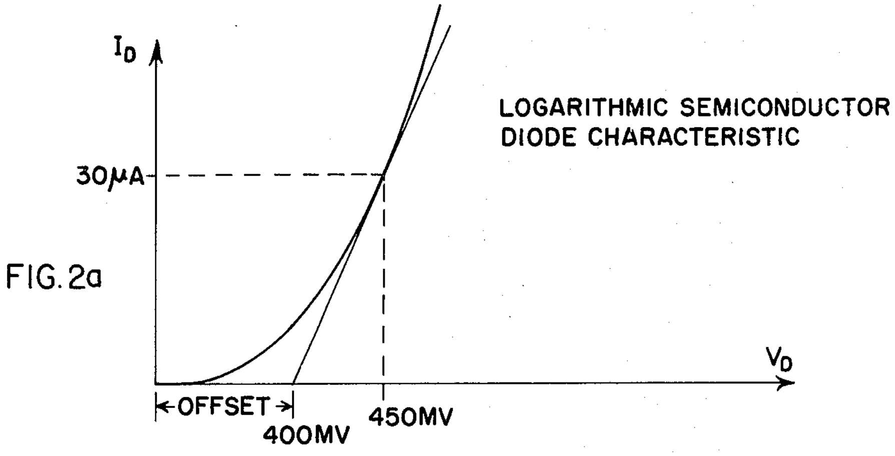
FIG. 2*a* is a graph of a diode resistance characteristic.
Figure 2B:
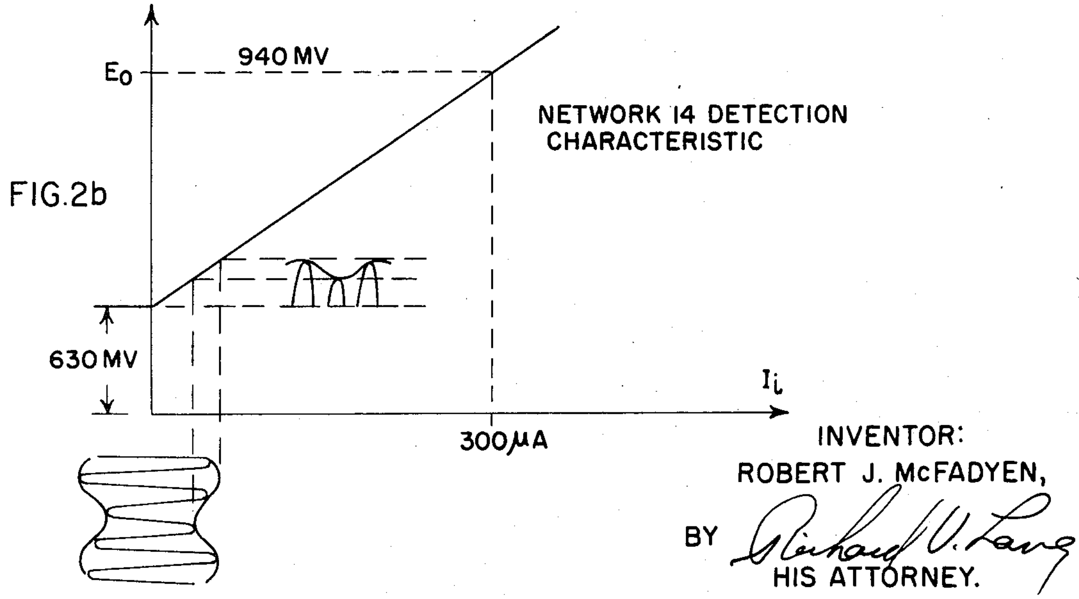
FIG. 2*b* is a graph illustrating the performance of the invention in the detection of an amplitude modulated signal.

Experimental data is shown in FIGS. 2*a* and 2*b*. In 2*a*, a conventional diode characteristic is illustrated. The initial diode offset of 0.3 – 0.4 volts and the continuously changing nonlinearity in the first quadrant rectification characteristic poses a severe problem in achieving linear detection. FIG. 2*b* illustrates the detection performance of applicant's network 14. The detection characteristic avoids both the effects of the offset and of diode nonlinearity. The detection characteristic has a zero slope in the fourth quadrant changing abruptly at the quadrant boundary to a sloping linear trace in the first quadrant.

The normally high reverse resistance of the diode 25 in part produces the zero slope characteristic of the fourth quadrant. It is also partly due to the forward gain of the amplifiers 22 and 23. If they are assumed for purposes of analysis to be momentarily unchecked by degenerative feedback, any small positive going signal at the base of input transistor 22 will be phase inverted and amplified to a higher negative level in the output of transistor 23 where it will tend to drive the diode 25 further unto cutoff. Thus any rectified output component is avoided and zero slope is achieved.

The sudden transition at the first quadrant boundary into a sloping linear detection characteristic is partially attributable to the forward gain of the amplifiers 22 and 23. If they are assumed, for purposes of analysis, to be momentarily unchecked by degenerative feedback, any small negative going signal at the base of input transistor 22 will be phase inverted and amplified to a higher positive level in the output of transistor 23 where it will tend to drive the diode 25 into a higher state of conduction. The presence of degenerative feedback, however, which is present with signals of this polarity, forces the output characteristic into conformity with the proportionality of expression (1) and the proportionality starts from the onset of forward conduction in diode 25.

Summarizing, the effect achieved by coupling the detector 25 at the amplifier output and rectifying the signals in the degenerative feedback path of the network 14 is to produce a very sudden transition in the output characteristic between the fourth and first quadrants and to linearize the first quadrant characteristic in accordance with expression (1).

The experimental curve in FIG. 2*b* illustrates the essentially zero slope characteristic in the fourth quadrant explained above. The graph is also a visual explanation of the effect that without a slope in that quadrant, no rectified output is produced. In the first quadrant of FIG. 2*b*, however, the sloping linear characteristic appears and it appears to commence on the very axis separating the two quadrants. The onset of the sloping characteristic determines the minimum level at which a detected output will occur. Practical measurements indicate that the sloping characteristic commences at 3 microamperes of input signal current and that linear operation continues until a level of several hundred microamperes of input signal current is attained. The relationship between input current and input voltage is linear; the input voltage divided by the IK ohm input resistor (27) equaling the input current.

The offset between the fourth and first quadrant is small because the high open loop gain has minimized the affect of the diode offset and also because the bias current through feedback resistor 31 is small under quiescent conditions.

The excellent measured linearity further illustrates the effectiveness of using an amplifier terminating in a low impedance emitter follower 23 to drive the diode 25. Expression (1) is premised upon the assumption of a nominal detector input level which establishes a given dynamic resistance for the diode 25. In fact, this characteristic is not static but changes gradually as illustrated in FIG. 2*a*.

The excellent observed linearity may be further explained. Coupling the detector diode 25 into the output of the emitter follower stage 23 decouples the changing diode resistance from the transistor amplifier 22. The high voltage gain of the amplifier 22 is approximately proportional to the collector load impedance and accordingly, any fluctuations in load impedance would occasion proportional fluctuations in that gain. Decoupling occurs because the input impedance of the emitter follower 23, irrespective of load, is still substantially higher than other elements making up the collector load impedance. Thus while changes in diode resistance do occur, they do not reduce the input impedance of the emitter follower 23 sufficiently to have an affect upon the collector load impedance, nor upon the gain. In addition, the voltage gain of the emitter follower is at all times near unity and is itself essentially independent of changes in load. Accordingly one factor leading to the observed detection linearity is that in this amplifier configuration, the forward gain is independent of changing detector diode resistance.

A second factor leading to improved linearity, which is attributable to the use of the final emitter follower configuration, is in its minimization of the open loop output impedance of the amplifiers 22, 23. Since the amplifier 24 is of high input impedance relative to the output impedance, the open loop output impedance remains unaffected by the output connection. The emitter follower configuration is intrinsically of low impedance and the use of degenerative feedback further reduces the output impedance levels of that amplifier. Since both measures reduce the output impedance levels relative to the load presented by amplifier 24, feedback loss is minimized. Maintaining both a stable high voltage gain throughout network 14 and low feedback loss in the output of the network 14 thus improves the linearity of the demodulated signal and generally reduces distortion occuring in the demodulation process.

The illustrated circuit has additional advantages in the efficiency in which the operating points of the active elements are established. Returning the cathode of the diode 25 through the dc feedback path provided by resistance 31 to the base of the transistor 22 ties the two to approximately the same dc potential (approximately 0.75 volts above ground). Assuming a drop in diode 25 of 0.4 volts and a drop across the input junction of transistor 24 of about 0.75 volts, a convenient collector potential is established for transistor 22 of approximately 1.9 volts above ground. Assuming a bias source of 9 volts, a 10K resistance 20 will establish a collector current of approximately 0.7 milliamperes. With an emitter load resistance of 2K for transistor 23, no other impedances are required to establish the operating points of transistors 22 and 23.

The foregoing configuration provides an economic base bias source for the a.g.c. and audio amplifying transistor 24. The base of transistor 24 is directly connected to the cathode of diode 25. By virtue of the direct current path through resistance 31 tying the bases of transistors 22 and 24 together, both bases will have approximately the same potential with respect to ground. (The base current of transistor 24 flowing in resistance 31 will typically place it 0.01 volts above the base of transistor 22). The current biases are chosen such that transistor 24 operates at a lower current level than transistor 22, typically at 300 microamperes. Under this condition and with the assumption that transistors 22 and 24 are identical, it follows that the base-emitter voltage of transistor 24 will be lower than the base-emitter voltage of 22, typically 30 millivolts lower. This difference in base-emitter voltages is obtained across the emitter resistor 32. Since this voltage is small, the value of resistor 32 can be small enough to eliminate a bypass capacitor otherwise required to reduce audio frequency degeneration.

With the foregoing circuit provisions and a dc collector load resistance of 10,000 ohms, the amplifier 24 exhibits a dc gain approaching 100. This high dc gain insures excellent automatic gain control sensitivity. At the same time, a more modest ac gain, generally around 3 to 5, is achieved in the same stage. This raises the detected signal to the level of approximately 200 millivolts peak to peak at the potentiometer 35, which is a convenient level for audio utilization.

Assuming an initial match in the properties of transistors 22 and 24, the detection function and a.g.c. function will remain unimpaired against temperature induced changes and against falling source potentials. In order to achieve a match of the properties of transistors 22 and 24 the foregoing circuit may be conveniently carried out in monolithic form with the transistors 22 and 24 being formed simultaneously in adjacent regions of a common semiconductive chip.

Assuming the desirability of achieving a match in the properties of the transistors 22 and 24, the most significant property is the requirement that the differential between base-emitter voltage drops ($V_{be}$) not exceed 5 millivolts and that the drift of this property not exceed 5 to 10 microvolts per degree centigrade. For integrated circuit technology this degree of matching is readily achieved.

Matching transistors 22 and 24 in this manner, insures that the collector potential of 24 will lie within a narrow initial tolerance and will be stable with time and temperature. In addition, the voltage across the emitter resistance 32 is logarithmically related to the power supply voltage. By virtue of this relationship, the current in the output stage 24, hence the stage's voltage gain, will not drop appreciably with normal reductions in the power supply voltage as may occur with dropping line voltages or battery deterioration.

The detector and automatic gain control network 14 has been described so far primarily in terms of electrical circuit details and circuit performance. The topology and fabrication is also of interest. The network may be fabricated by any of several new techniques. The selection of transistors and diodes is in contemplation of using solid state components as the active components of the circuit. These components may be formed individually or integrally into a larger common substrate or chip.

The selection of component values and the design of the circuits permits a largely integrated radio receiver circuit in which the active and certain passive components are formed by a factory process upon a single semiconductive chip. In practice full integration on a chip cannot include the antenna, the loudspeaker, the individual controls (the volume control, the tuning selector, etc.); nor is it practical at this stage of the art to include many inductive or larger valued capacitive components on the chip. Accordingly, the preferred topology contemplated herein takes advantage of integrated circuit assembly techniques for the active and resistive elements, and brings terminals to the margin of the chip for connecting those components which are not conveniently formed upon the chip. In particular, the transistors (22, 23, 24) diode 25, all fixed resistors (20, 27, 28, 30, 32, 33) may be fabricated directly upon the chip while the input coupling capacitor (26) and the audio coupling (39) and filter (36) capacitors, the potentiometer (35) and the a.g.c. filter capacitor (21) are external to the chip.

The circuit illustrated in FIG. 1 represents a system that has a highly sensitive a.g.c. loop by having a large dc gain in transistor stage 24. This selection does impose upper limits upon the dynamic range of stage 24 since the detected dc current will lower the saturation level of stage 24, and in turn set a limit on the maximum signal to be detected. This limit is thus imposed not by the diode per se but by its output circuitry. A tradeoff in design of the present circuit thus occurs between the maximum input signal that the total circuit can tolerate and the sensitivity of the a.g.c. loop. By reducing the collector load resistor 33, one may achieve a further increase in dynamic range (beyond 26 db) at the upper signal levels, with a proportionate reduction in the dc gain available for the a.g.c. loop.

The network so far described is of high performance relative to conventional diode detectors. Detection performance measurements indicate that 30 percent modulated signals can be detected with less than 2 percent distortion in a range extending from 50 mv peak to peak (approximately 18v rms) to 1 volt peak to peak (approximately 0.35v rms). At a typical input level of 600 mv peak to peak a total harmonic distortion of one-half to 1 percent is achieved for a 30 percent modulated signal. Where the signal is 80 percent modulated, total harmonic distortion is less than 3 percent over the same input range and at 600 mv peak to peak the distortion level is 2 percent. Thus, in a conventional application where the maximum I.F. signal will be on the order of 1 volt peak to peak, the linear dynamic range (assuming no more than 2 percent distortion at 30 percent modulation) is about 26 db as compared to 6 db for a simple diode detector.

Figure 3:
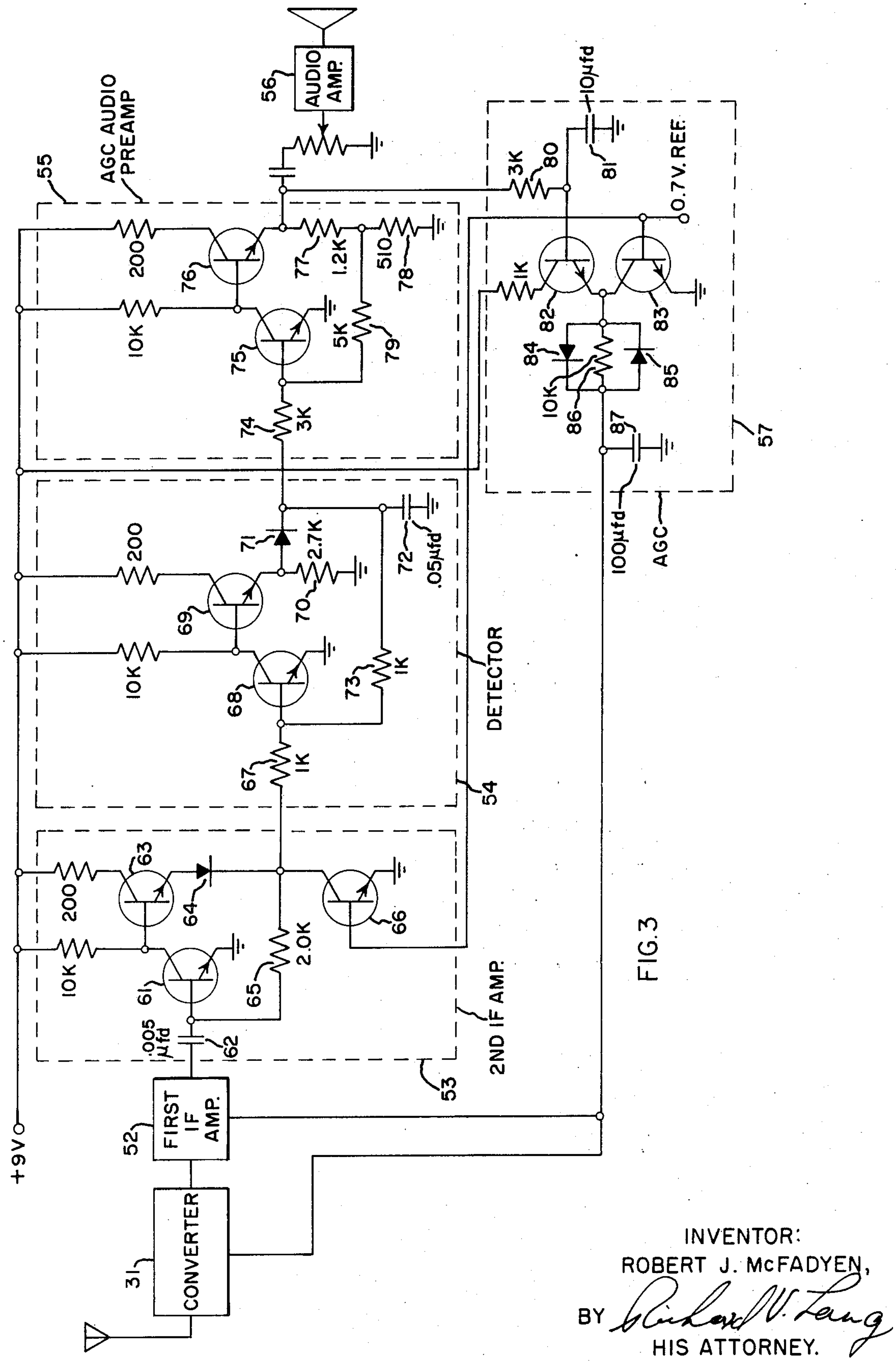
FIG. 3 is an electrical circuit representation of a novel detector and automatic gain control network embodying peak detection and contains additional features in the automatic gain control network.

The second embodiment which is illustrated in FIG. 3 also performs detection and automatic gain control functions, the detection technique being peak detection and the refinements in the circuit being generally directed toward further reducing distortion in the detected signal below values achieved in the first embodiment. Generally, the distortion in the first embodiment lies within the range of from one-half to 2-½ percent, a figure which in ordinary home receivers is quite excellent. The refinements that the second embodiment proposes further reduce the distortion to a point where it generally lies within the range of 0.1 – 1 percent. The FIG. 1 embodiment does, however, have a slightly greater immunity to impulse noise than the FIG. 3 embodiment.

As illustrated in FIG. 3, the superheterodyne receiver embodying the invention may be regarded as comprising six major blocks — converter 51, a first IF amplifier 52, a second IF amplifier 53 (whose circuit is depicted in detail), the peak detection circuit 54, an automatic gain control and audio preamplifier 55, an output audio amplifier 56, and an automatic gain control network 57.

The converter 51 is connected to an antenna of other suitable source of amplitude modulated input signals and converts the same to a suitable intermediate frequency. The first IF amplifier 52 accepts the intermediate frequency signal and provides filtering for adjacent channel suppression and gain to bring the input signal up to a higher level.

The second IF amplifier comprises a transistor doublet having shunt feedback provisions. The input signal from the first IF amplifier is coupled to the base of the first transistor 61 of this doublet by the coupling capacitor 62. The emitter of transistor 61 is grounded while its collector is connected to a source of positive bias potentials through a load resistance. The amplified intermediate frequency signal appearing at the collector of transistor 61 is coupled to the base of the second transistor (63) of the doublet. The transistor 63 operates as a modified emitter follower with a relatively low resistance coupling its collector to the positive source of bias potentials and the output signal being derived from its emitter. The emitter of the transistor 63 is connected to the anode of a voltage dropping diode 64 whose cathode is in turn connected to the collector of a transistor 66, the latter operating as a constant current bias source. Transistor 66 establishes the operating current of the transistor 63. The output of the amplifier is derived from the cathode of the diode 64 and it is between this point and the base of transistor 61 that the shunt feedback resistor 65 is connected. The shunt feedback resistor provides a shunt feedback path for controlling the a.c. gain as well as a d.c. path to the base of transistor 61 for establishing its operating point.

Amplifiers 53's signal source is capacitively coupled through capacitor 62, therefore, the second I.F. amplifier 53 provides additional amplification for the intermediate frequency signal without further d.c. amplification. The shunt feedback connection provides some degeneration (approximately 10 db), with the illustrated circuit having a typical a.c. gain of 25–30 db.

The peak detection circuit 54 detects the intermediate frequency signal and retains the linearizing feedback provisions of the first embodiment. It differs in its use of peak detection.

The peak detector 54 also comprises a transistor doublet in much the same configuration as illustrated in the second I.F. amplifier 53. The input signal from the second I.F. amplifier 53 is coupled to the base of the transistor 68 of the second doublet by a resistance 67. The emitter of transistor 68 is grounded while its collector is connected to a source of positive bias potentials through a load resistance. The amplified signal appears at the collector of transistor 68 and is coupled to the base of the second transistor (69) of this double. The transistor 68 has its collector connected to a source of positive bias potentials through a relatively low resistance and the output signal is derived from its emitter, the emitter being coupled to ground through a load resistance 70 and to the anode of detector diode 71. The cathode of diode 71 is connected to a capacitor 72 whose other terminal is connected to ground. The diode cathode is also connected to one terminal of resistance 73 which is in turn connected to the base of transistor 68. The capacitor 72 has a value suitable for filtering out signals above audio frequencies. The resistance 73 serves as a shunt feedback connection for linearizing the detection characteristic of the detector as in the first embodiment. The gain for a.c. and d.c. approximates unity. The elements 72, 73 together with the other resistive elements (e.g. 74) shunting the capacitor 72 provide a suitable time constant for operating the detector 54 as a peak detector.

The circuit of the detector 54 in FIG. 2 is thus quite similar to that in FIG. 1, retaining the same basic forward gain and feedback configuration to achieve highly linear half wave detection. The detection circuit 54 differs from the FIG. 1 configuration in that the cathode of the detector diode 71 and the detector now becomes a peak detector rather than an averaging detector. The audio filter may be regarded as including the components 72, 73 and 74. The audio filter has a time constant of about 40 microseconds, a value which should be fast enough to permit the detection circuit to reproduce the highest modulation frequency.

The advantage of peak detection is that it substantially eliminates two of the residual sources of distortion present in the prior averaging detector. In respect to relatively low level input signals, the peak to peak distortion of the peak detector is typically less than 1 percent whereas at typical input level signals, the distortion approaches 0.1 percent. One cause for this residual nonlinearity in detection is a result of bandwidth limitations of the associated amplifier. The effect of a bandwidth limitation is to produce a delay in conduction at the onset of conduction for each half cycle at the I.F. frequency. This delay, which distorts the detected waveform, distorts the average modulation voltage recovered by an averaging detector as a function of the modulation index and as a function of the detected signal level. Thus, when the detector is dependent on averaging the detected waveform, the error will appear in the detected signal. If the peak detection is employed, the small nonlinearities at the onset of conduction will not affect the peak voltages attained at the diode and the peak detection process will be unaffected by their presence.

The use of peak detection also achieves a second correction which further lessens distortion. In the FIG. 1 embodiment a small amount of distortion is due to a shift in the base line of the detector due to off half cycle feedthrough to the detector output. This feedthrough occurs through shunt feedback resistance 31. When the detector operates upon an average of the rectified waveform, as in FIG. 1, small pulses of current will flow during the off half cycles, and will affect the average signal level as applied to the input of the amplifier 24. This base line distortion is a function of the signal level and the percentage of modulation. By converting the circuit to detect the peak, the diode output voltage reflects the peak and ignores the valleys, thus leading to a detected output which is unaffected by shifts in the base line during "off" half cycles.

The automatic gain control and audio preamplifier block 55 also takes the form of a transistor doublet with shunt feedback, a configuration which is basically low distortion. The detected amplitude modulation signal is derived from the peak detector 54 through a resistor 74 coupled between the base of transistor 75 and the cathode of detector diode 71. The transistor 75 has its emitter grounded and couples an amplified signal to the base of the transistor 76 from the emitter of which load resistances 77 and 78 are serially connected to ground. Shunt feedback is achieved by the resistance 79 which is connected between the base of transistor 75 and the connection between resistor 77 and 78.

The automatic gain control and audio preamplifier block 55, being d.c. coupled, provides amplification of both the detected audio signal as well as d.c. components. With a typical gain of about 6 units, the circuit raises the audio signal to the conventional levels required in typical audio amplifiers and at the same time establishes large enough voltages for the automatic gain control function. The output of block 55 is taken from the emitter of transistor 76 and applied through a volume control network to a suitable audio amplifier 56. At the same time, an output is applied to the input of the automatic gain control network 57.

The automatic gain control network 57 has been additionally modified to achieve sensitive and fast automatic gain control action, while at the same time removing a third source of residual distortion in the detected audio signal. This third source of residual distortion results when audio frequency components enter the automatic gain control paths and cause a multiplication of the signal components in the rf or if amplifiers by the demodulated signal.

The automatic gain control network 57 comprises an input low pass filter formed by a resistor 80 and a capacitor 81, an output low pass filter exhibiting a nonlinear time constant comprising diodes 84, 85, resistor 86 and capacitor 87, and an intermediate emitter follower stage comprising transistors 82 and 83 for isolating the two filters.

The input low pass filter comprises a resistance 80 connecting the emitter of the a.g.c. and audio amplifying transistor 76 to the base input connection to the emitter follower transistor 82. The capacitor 81 of the input filter is connected between the base of the transistor 82 and ground. The a.g.c. input filter 80, 81 produces a high frequency roll-off commencing at about 5 cycles and produces an attenuation of approximately 20 db at 50 cycles and 40 db at 500 cycles. The a.g.c. input filter 80, 81 thus reduces the magnitude of audio components entering the automatic gain control circuit while at the same time admitting d.c. components.

The emitter follower transistor 82 of the a.g.c. circuit has its collector connected through a resistance to a source of B+ potentials and its emitter coupled to the collector of a second transistor 83 serving as a constant current source for the transistor 82. The base of transistor 83 is connected to a 0.7 volt source, this being the same source to which the constant current source 66 is connected. The output low pass filter of the a.g.c. circuit is connected to the emitter of the emitter follower 82 and comprises a series circuit consisting of a pair of reversely poled diodes 84, 85 shunting a series resistance 86. The shunt capacitor 87 coupled between the output terminal of the series circuit and ground completes the output filter and filtered automatic gain control voltages are coupled from the ungrounded terminal of this capacitor to the converter 51 and first IF amplifier 52 for achieving the automatic gain control function.

In the prior embodiment in which only a single stage of low pass filtering was employed and in which the low pass filter was adjusted to provide a conventional time constant, it was determined that a small amount of audio modulations entered the a.g.c. network and by multiplying with the input signals produced a small distortion of the signal being amplified. One way to avoid this feedthrough of audio energy would be to increase the time constant of the a.g.c. filter to the point where audio components are no longer significant in the a.g.c. bus. The difficulty with this approach is that it increases the sluggishness of the automatic gain control circuit when one is tuning from station to station. Applicants' approach is to employ the two stage filter so far described. The input filter is of a relatively short time constant but has a substantial attenuative affect upon the audio components (as so far described). The output filter, which will now be discussed in detail, thus receives the d.c. component from the detection process essentially without attenuation while receiving the components in the audible range with a very substantial attenuation. During quiescent periods (while no tuning is taking place), the output filter may be regarded as consisting of the resistance 86 and the capacitance 87, a combination which is set to have a longer time constant than the input filter. The roll-off point may typically occur at about 1 cycle and produce a proportionately increasing attenuation throughout the audio spectrum. Taken together with the attenuation of the input filter the composite attenuation of audio components by the two filters during quiescence may amount to 54 db at 50 cycles and approximately 94 db at 500 cycles. Thus, by the use of the two filters, the feedthrough of the audio components is very substantially eliminated when a received radio station is in tune.

However, when tuning is taking place, a sudden change in the signal strength, either up or down from the value stored on the capacitor 87 initiates conduction through one of the diodes. The transition of the diodes 84, 85 from a quiescent to a conductive stage may be regarded as gradual. From this viewpoint, the composite nonlinear resistance formed by the resistor 86 and diodes 84, 85 varies from the high value of resistor 86 which may be 10,000 ohms to a low value set by the dynamic resistance of the diodes 84, 85 in their fully conductive state. Since the dynamic resistance may be less than 100 ohms, the effective time constant of the output filter may be changed by a factor of approximately 100. Thus, during tuning, the a.g.c. circuit will respond rapidly, being limited only by the time constant of the input filter and the transient time constant of the output filter of the a.g.c. circuit.

Since the diodes 84 and 85 can rectify a.c. components that would be applied to the diodes 84, 85 and thus by peak detection apply a detected audio to the a.g.c. bus, the input filter 80, 81 avoids this by its initial suppression of audio components. In addition, since both diodes require a certain threshold voltage before full forward conduction can occur (or gradually achieve this state), the lower impedance is not practically available to lower level a.c. components.

The foregoing circuit has a station acquisition time of about 50 milliseconds and release time of about 300 milliseconds, times which are common with conventional AM radios. At the same time, any contributions to the distortion of the detection process are generally held below 0.5 percent with modulation indices up to 80 percent.

The ability of the present detector to develop a linear output is thus of particular value in extending the detection range down to the lower input signal levels where conventional diode detectors ordinarily lose tolerable linearity. Low level detection is particularly advantageous when a detector is employed in a high performance receiver where it is desirable that the sensitivity of each portion of the receiver contribute to a high general sensitivity or when the detector is employed in integrated circuit applications where it is preferably for the prior or succeeding amplifier stages to operate at lower signal levels. The detector may be used to demodulate a variety of amplitude modulated signals for audio, visual and data purposes (including telemetry)where the received power is low.

What is claimed as new and desired to be secured by Letters Patent in the United States is:

1. In combination:

a. a source of amplitude modulated signals, modulated with audio information, b. a linear detection circuit for said amplitude modulated signals comprising an amplifier coupled to said source having a forward gain path and a degenerative shunt feedback path passing modulation frequencies for linearizing the relationship between the detected output and the input modulation; and a semiconductor detection diode serially connected in the forward gain path at the output of said amplifier to detect the amplified signal and rectify the signal in said feedback path; and c. audio utilization means coupled to said semiconductor diode for deriving said detected audio information therefrom.

2. The combination set forth in claim 1 wherein:

a. said amplifier includes a first transistor in common emitter configuration and exhibiting high voltage gain, and a second transistor coupled thereto in an emitter follower configuration having substantially unity voltage gain;

b. said semiconductor diode being coupled to the emitter of said second transistor.

3. The combination set forth in claim 2 wherein the base-emitter junction of the first transistor, the diode junction, and the base-emitter junction of the second transistor are serially connected in a dc path to the collector of said first transistor to establish a collector potential substantially equal to the sum of the successive voltage drops in said junctions.

4. The combination set forth in claim 3 wherein the emitter of said first transistor is grounded and a load resistance is provided connecting the collector thereof to a dc source; and the collector of said second transistor is connected to said dc source, and a load resistance is provided connecting the emitter thereof to ground.

5. The combination set forth in claim 4 wherein said degenerative shunt feedback path is provided by a resistance connected between the base of said first transistor and the electrode of said diode remote from the emitter coupled electrode.

6. The combination set forth in claim 5 having in addition thereto, a third transistor connected in voltage amplifying common emitter configuration, the emitter thereof being connected to ground by a low impedance path, the base thereof being dc connected to said remote electrode of said diode to establish said electrodes at a common potential and to couple detected audio information to said third transistor, and a load resistance connecting the collector thereof to said dc source having a value suitable for dc and audio amplification.

7. The combination set forth in claim 6 wherein said low impedance path is provided by a resistance sufficiently small to avoid appreciable audio frequency degeneration.

8. The combination set forth in claim 7 wherein a low pass filter set to pass frequency components below audio frequency is connected to the collector of said third transistor for derivation of an automatic gain control voltage therefrom.

9. The combination set forth in claim 8 wherein a second low pass filter is provided coupled to the collector of said third transistor for eliminating frequency components above audio frequency in the path to said audio utilization means.

10. The combination set forth in claim 9 wherein the dc output impedance at the collector of said third transistor is set high to achieve a large dc gain for sensitive automatic gain control action and the audio frequency output impedance at said collector is small to achieve a substantial but relatively smaller audio frequency voltage gain.

11. The combination set forth in claim 6 wherein said third transistor is matched to said first transistor in respect to their base-emitter voltages and the thermal drifts of said base-emitter voltages.

12. The combination set forth in claim 2 wherein:

a. said degenerative shunt feedback path is provided by a resistor connected between the base of said first transistor and the electrode of said diode remote from the emitter coupled electrode, and further comprising b. a capacitor coupled between said remote diode electrode and signal ground for achieving peak detection of said amplitude moduled signals.

13. The combination set forth in claim 12 wherein:

a. an additional direct coupled amplifier is provided for amplification of said detected audio signal and an automatic gain control voltage, and b. an automatic gain control network is provided having means for filtering said amplified automatic gain control voltage before application, said filtering means comprising a first low pass filter section, a second low pass filter section having a nonlinear series resistance, and filter isolation means introduced between said filter sections, whereby the attenuation of said two filter sections to audible frequency components is added logarithmically.

14. The combination set forth in claim 13 wherein a. said isolation means comprises a transistor in emitter follower configuration, and b. wherein said nonlinear resistance is provided by a resistor having in shunt therewith a pair of reversely poled semiconductor diodes which selectively introduce their dynamic resistance in proportion to the magnitude of automatic gain control transients occurring during tuning to selectively shorten the response time of the network.

15. The combination set forth in claim 14 wherein the low frequency roll of of said first low pass filter is established below the audible spectrum, and wherein the low frequency roll off of said second low pass filter is variable from substantially below that of said first filter during quiescent conditions to low audible frequencies during tuning.

* * * * *